(12) United States Patent
Feygin et al.

(10) Patent No.: US 6,420,983 B1
(45) Date of Patent: Jul. 16, 2002

(54) ON-LINE OFFSET CANCELLATION IN FLASH A/D WITH INTERPOLATING COMPARATOR ARRAY

(75) Inventors: Gennady Feygin, Livingston; David A. Martin, Atlantic Highlands; Krishnasawamy Nagaraj, Somerville, all of NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/578,283

(22) Filed: May 25, 2000

(51) Int. Cl.[7] ................................................. H03M 1/06
(52) U.S. Cl. ....................................... 341/118; 341/120
(58) Field of Search ................................ 341/118, 159, 341/144, 145, 156

(56) References Cited

U.S. PATENT DOCUMENTS

| | | | | |
|---|---|---|---|---|
| 5,194,867 A | * | 3/1993 | Fisher | 341/159 |
| 5,349,354 A | * | 9/1994 | Ito et al. | 341/156 |
| 5,459,465 A | * | 10/1995 | Kagey | 341/156 |
| 6,218,975 B1 | * | 4/2001 | Tsukamoto et al. | 341/159 |

OTHER PUBLICATIONS

Sanroku Tsukamoto, et al., "A CMOS 6–b, 200 Msample/s, 3 V–Supply A/D Converter for a PRML Read Channel LSI," IEEE Journal of Solid–State Circuits, vol. 31, No. 11, pp. 1831–1836, Nov. 1996.

* cited by examiner

Primary Examiner—Peguy JeanPierre
Assistant Examiner—Joseph J Lauture
(74) Attorney, Agent, or Firm—J. Dennis Moore; W. James Brady, III; Frederick J. Telecky, Jr.

(57) ABSTRACT

A method for performing an auto-zero function in a flash analog to digital converter ("ADC"), the ADC including a reference voltage circuit, providing a plurality of evenly spaced analog reference voltages, and a plurality of system voltage comparators for comparing an input voltage against the reference voltages and providing an indication of which reference voltage corresponds to the input voltage. In the method the following steps are performed. A plurality of redundant voltage comparators are provided. A subset of the plurality of system voltage comparators are selected. Auto-zero is performed on the selected comparators, and the redundant comparators are used in the place of the selected comparators. The outputs of the main comparator array and the extra comparators are combined to produce a final digital output.

5 Claims, 5 Drawing Sheets

ON-LINE OFFSET CANCELLATION IN FLASH A/D WITH INTERPOLATING COMPARATOR ARRAY

TECHNICAL FIELD OF THE INVENTION

This invention relates to analog-to digital converters ("ADCs"), and more particularly relates to methods and apparatus for improving the performance of flash ADCs.

BACKGROUND OF THE INVENTION

Analog-to-Digital converters (ADC) are an important class of semiconductor components used widely in signal processing, instrumentation, communications and data storage. FIGS. 1(A) and 1(B) show a portion of a flash ADC 10, in two different modes. FIG. 1(A) shows the flash ADC 10 in auto-zero mode, while FIG. 1(B) shows the flash ADC 10 in sample conversion mode. A resistor ladder 12 is connected between plus and minus reference voltages $V_{REF}+$ and $V_{REF}-$, respectively, to form $2^n$ evenly spaced analog reference voltages, of which two are shown in FIG. 1(A). A charge corresponding to these $2^n$ reference voltages is stored on each of $2^n$ corresponding capacitors 18. The ADC 10 shown in FIGS. 1(A) and (B) has a resolution of n+1 bits.

An analog input voltage $V_{IN}$ is captured periodically by a sample and hold ("SH") circuit 14, and, as shown in FIG. 1(B), is compared to the $2^n$ reference voltages in a corresponding number of comparators arrayed along these reference voltages. The comparator function is provided in the ADC 10 of FIG. 1(B) by the combining of $V_{IN}$ and the reference voltages from the charge stored on the array of capacitors 18. When $V_{IN}$ overcomes the reference voltage on a particular capacitor in the array 18, the resulting positive voltage is amplified by the preamps P1 and P2, tripping an associated latch 16, and thus storing a data value of "1." Assigning a number to each such comparator, the number of the comparator in the array at which the analog input goes from being below to being above the reference voltage corresponds to the digital representation of the analog input.

As the speed of flash ADCs has grown, various problems have arisen which need to be solved. One problem is the error in flash ADCs from the mismatch in the comparators. This mismatch changes the analog value at which the output of a comparator changes from zero to one, thus degrading the accuracy of the ADC. A solution developed to correct this problem is to auto-zero the comparators in order to cancel the offset. Usually, this offset correction is stored as a voltage on a storage capacitor.

Since capacitors slowly leak charge, it is necessary to perform this auto-zero operation on the array of comparators periodically. In low speed flash ADCs, which have long clock cycles, this auto-zero function can be done on every clock cycle. However, the clock cycle of a high speed ADC is too short for the auto-zero function to finish. Therefore, in high speed ADCs the auto-zero function must be performed during idle periods.

However, for some applications, such as communications applications, the idle times are not available. A common technique used to overcome this problem is to auto-zero only one comparator at a time. An extra comparator is used temporarily, to take over the functionality of the comparator being auto-zeroed. See, for example, S. Tsukamoto et al., "A CMOS 6-b, 200 MSample/s, 3V Supply A/D Converter for a PRML Read Channel LSI," IEEE *J. Solid-State Circuits*, Vol. 31, No. 11, pp. 1831–1836. This technique is referred to herein as on-line auto-zero, since it allows the ADC to convert continuously without being taken off-line to perform its auto-zero function.

Another problem encountered in flash ADCs is the speed bottleneck in the SH circuit at the front end. One technique used to reduce this bottleneck is to reduce the capacitive load on the SH circuit, thereby reducing the time needed to provide a reliable sample voltage. This is accomplished by eliminating the first stage preamps of half of the comparators, so that the SH load is reduced by a factor of two. The outputs of two adjacent first stage preamps are interpolated to provide inputs for the second stage preamps of the comparators that do not have first stage preamps.

This technique is used in the ADC shown in FIGS. 1(A) and (B), in which half of the first stage preamps have been eliminated. Note that the analog signal path in these figures may be differential even though it is shown as single-ended in the figure for clarity. Note also that some of the P2 preamps are interpolating preamps, and are identified by P2'. These P2' preamps interpolate between adjacent P1 preamp outputs.

As mentioned above, FIG. 1(A) shows the ADC 10 configuration during an auto-zero ("AZ") period. There are actually two phases of this auto-zero period. Since a second stage interpolating preamp P2' requires a zero input to perform its auto-zero, during the first phase of AZ, the first stage preamps P1 have their reset switches turned on, i.e. are reset, so that their output is zero. Preamps P2 are auto-zeroed during this phase of AZ. For the interpolating P2's, this also cancels any offset due to differences in the P1 reset mode output voltages. During the second phase of AZ, the reset switches of preamps P1 are turned off, and the preamps P1 are auto-zeroed and their offsets are stored on the capacitors 18.

The coupling capacitors 18 that connect the SH to the preamps P1 thus store both the offset of P1 and the reference voltages generated from resistor ladder 12 for P1. The consequence of this is that in order to auto-zero a P2' preamp that interpolates between two P1 preamps, both P1 preamps must be reset during the first part of AZ. Since these P1s supply inputs not only for the P2 being auto-zeroed, but also for their own P2s and the P2s both above and below them, a total of five outputs are affected by the auto-zero of one P2.

This means that, if one comparator is to be auto-zeroed at a time in the array and its output replaced with the output of an extra comparator, a problem exists. A total of five main array outputs are affected by the auto-zero: the comparator being auto-zeroed, the two above it, and the two below it. This is shown in FIG. 2, which shows the progression of AZ through the array. Question marks identify outputs being affected by the auto-zeroing process. The black preamps are the ones being auto-zeroed, and the gray ones are those that are not being auto-zeroed but which have outputs affected by the auto-zeroing process currently being performed.

SUMMARY OF THE INVENTION

The present invention involves a circuit architecture which combines two common flash ADC techniques used in high speed flash ADCs, described above, and which solves some of the problems that arise from combining these two techniques. In accordance with the present invention, a method is provided for performing an auto-zero function in a flash analog to digital converter ("ADC"), the ADC including a reference voltage circuit providing a plurality of evenly spaced analog reference voltages, and a plurality of system voltage comparators for comparing an input voltage against the reference voltages and providing an indication of which reference voltage corresponds to the input voltage. In the method the following steps are performed. A plurality of redundant voltage comparators is provided. A subset of the plurality of system voltage comparators is selected. Auto-zero is performed on the selected comparators, and the redundant comparators are used in the place of the selected comparators.

These and other features of the invention will be apparent to those skilled in the art from the following detailed description of the invention, taken together with the accompanying drawings.

DETAILED DESCRIPTION OF THE PREFERRED EMBODIMENT

Figure 1A:
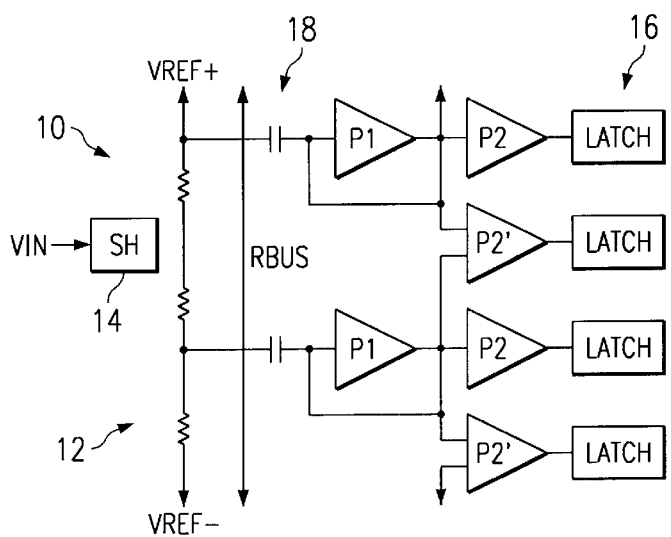
FIG. 1(A) is a diagram of a portion of a prior art flash ADC in auto-zero mode.
Figure 2A:
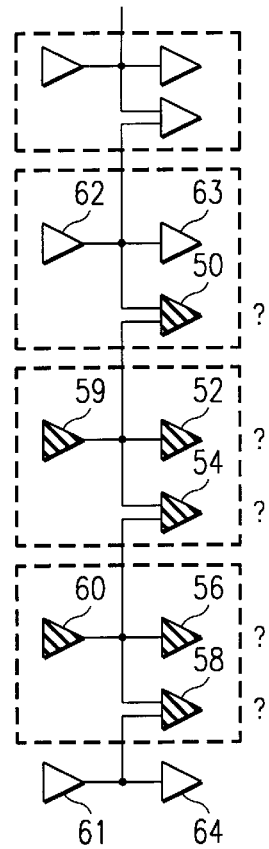
FIG. 2(A) is a symbolic diagram of a portion of a flash ADC array, showing a first set of comparator replacement selections and comparators affected thereby.
Figure 1B:
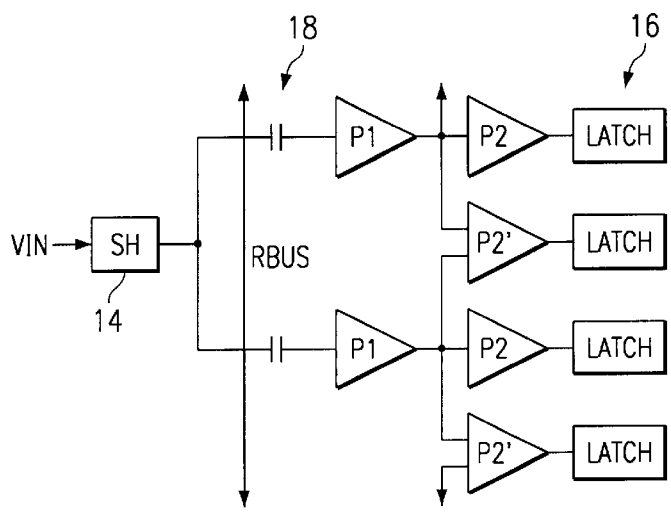
FIG. 1(B) is a diagram of a portion of a prior art flash ADC in sample conversion mode.
Figure 2B:
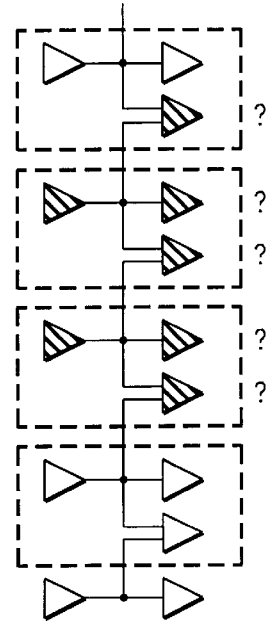
FIG. 2(B) is a symbolic diagram of a portion of a flash ADC array, showing a second set of comparator replacement selections and comparators affected thereby.

The preferred embodiments of the present invention comprise a method for performing auto-zeroing in a flash ADC. In performing auto-zero in accordance with a first preferred embodiment, wherein one P1 stage comparator is auto-zeroed at a time, a group of five comparators in the main array is removed from the normal operation at a time. For example, referring again to FIG. 2(A), the P2 comparators 50, 52, 54, 59, 60, 56 and 58 are all removed from normal operation during an auto-zero cycle, even though only preamps 52, 54, 59, 60 and 56 are being auto-zeroed during this cycle. This is done because of the ambiguity described above concerning the output of preamps 50 and 58.

Before this occurs, however, redundant comparators replace this group of comparators being temporarily removed. This is accomplished by performing the following steps:

1. Assume comparators k through k+4 are to be auto-zeroed. The first step is to place the corresponding reference voltages on an analog multiplexed bus, referred to herein as the Rbus, that provides the redundant comparators with reference voltages.

2. The redundant comparators are placed in an auto-zero mode, so that their offsets are cancelled, and proper reference voltages are stored on the associated capacitors.

3. The redundant comparators are switched out of auto-zero mode and into regular conversion mode. Barring any mismatches, the redundant comparators are now performing as an exact replica of comparators k through k+4.

4. Comparators k through k+4 are placed in an auto-zeroed mode.

5. Comparators k through k+4 are returned to regular operation.

6. Auto-zero cycle for comparators k+2 through k+6 begins as described in step 1.

Figure 3:
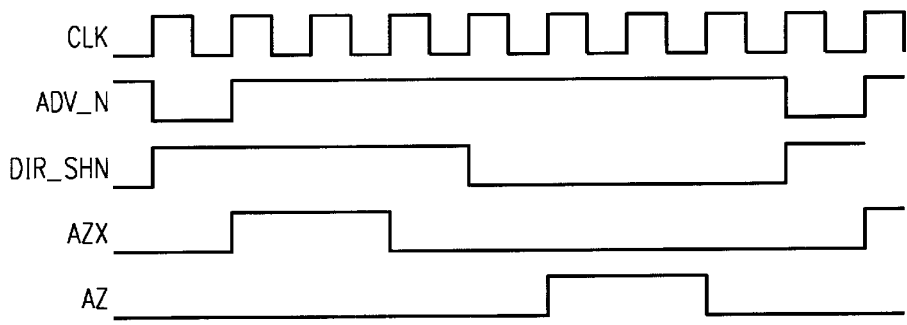
FIG. 3 is a waveform diagram showing various signals used in a flash ADC.

Pertinent waveforms appearing in an auto-zero cycle are shown in the waveform diagram of FIG. 3. Those waveforms are: system clock CLK, control signal ADV_N, control signal DIR_SHN, extra comparator auto-zero command AZX and main array comparator auto-zero command AZ. Note that a waveform designator ending in a capital N indicates that the associated signal has negative logic, i.e., is asserted when the level is low. For example, DIR_SHN is such a signal. Also note that a waveform designator ending in a capital X indicates that the signal is a command for the extra, i.e., redundant, comparators, as contrasted with the main comparator array. For example, AZX is such a signal. ADV_N is used to increment K. When it is high, the signal DIR_SHN indicates that the extra comparators are being auto-zeroed. The function of these signals is described in detail below in conjunction with the description of FIG. 4.

The auto-zero controller according to a preferred embodiment of the present invention comprises two major parts, a state machine and a shift register that is distributed into the comparator array, i.e. one flip-flop for every 2-bit comparator slice.

Figure 4:
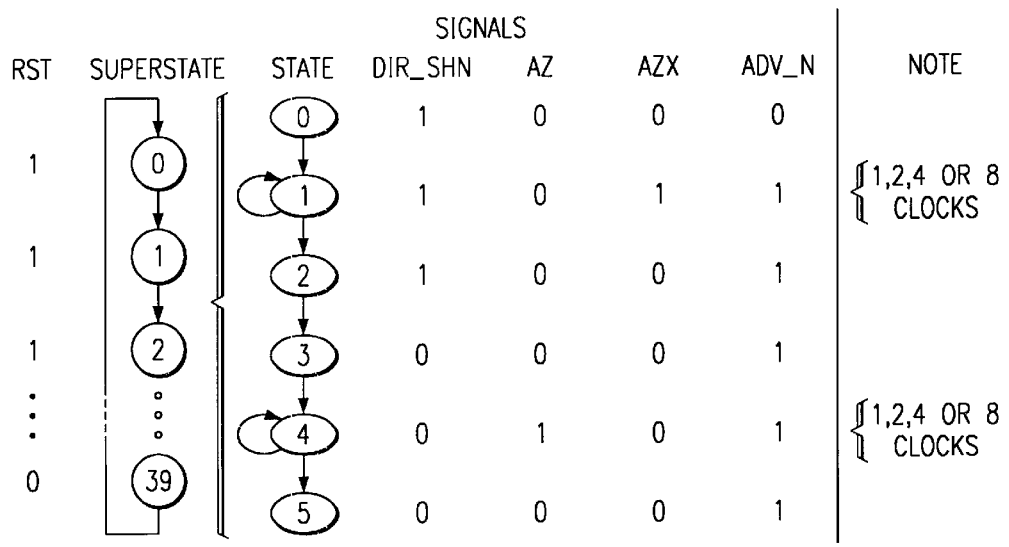
FIG. 4 is a flow diagram showing a sequence implemented in a state machine of a preferred embodiment of the present invention.

The state machine implements the sequence illustrated in FIG. 4. The state machine can be conceptually described as two nested counters. The six-state inner counter 20 will be described first, with reference to both FIG. 3 and FIG. 4.

In State 0, the DIR_SHN signal is set high and the ADV_N signal is asserted, i.e. driven low, thereby incrementing K. This incrementing of K is indicated in the Figure by the advancing of the outer counter 22 that marks the subset of five comparators that must be auto-zeroed. DIR_SHN signal being high places the comparator array into direct mode, in which all comparators in the main array are used, and Extra Comparators are not used.

In State 1, the AZX signal is asserted. This initiates the auto-zero cycle for the redundant comparators.

In State 2, the AZX signal is de-asserted. This state must be included to account for the latency between the time the redundant comparators leave auto-zero state and the time latched outputs of redundant comparators become valid.

In State 3, the DIR_SHN signal is brought low. This indicates that outputs of five comparators in the main array will not be used, and the outputs of the redundant comparators will be used instead.

In State 4, the AZ signal is asserted. This initiates the auto-zero cycle for the selected five comparators in the main array.

In State 5, the AZ signal is de-asserted. This state must be included to account for latency between the time the five original comparators leave the auto-zero state and the time latched outputs of these comparators become valid.

Note that States 1 and 4 may be of variable duration of 1, 2, 4 or 8 cycles. The reason for this is that the time needed for an auto-zero is fixed, but the clock period of the ADC operation is not. Therefore, the number of clock cycles required to complete an entire auto-zero operation must be increased in proportion to the operating frequency of the ADC.

Figure 5:
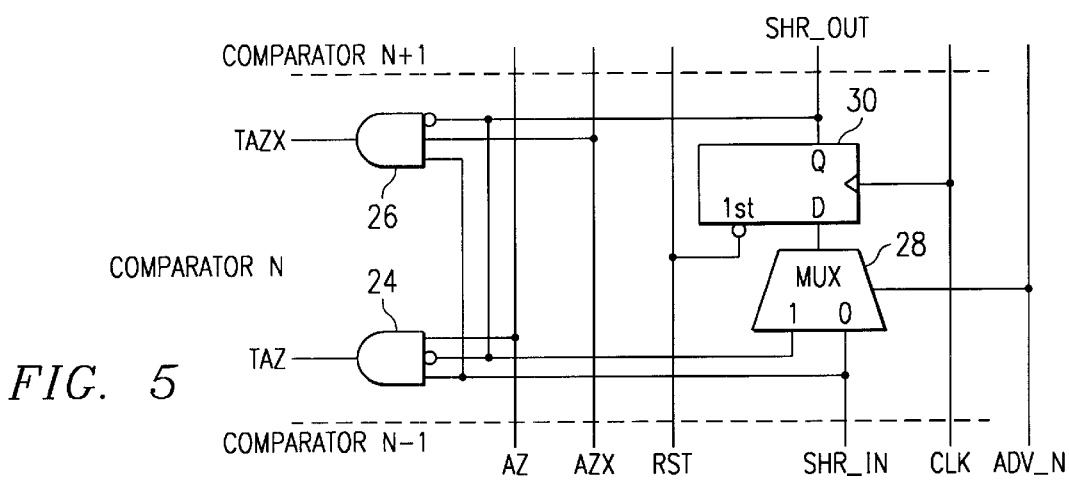
FIG. 5 is a logic diagram showing a section of a shift register portion of a control structure for a preferred embodiment of the present invention.

A section of the shift register portion of the control structure is shown in FIG. 5. One such section is provided for every two comparators in the comparator array. The section has as inputs lines for the signals AZ, AZX, RST (reset), SHR_IN, CLK and ADV_N. The section includes two 3-input AND gates 24, 26, and each of which has one inverting input, a two input multiplexer ("MUX") 28 and a DQ flip-flop 30. The AZ signal line is connected to the second non-inverting input of AND gate 24. The AZX signal line is connected to a first non-inverting input of AND gate 26. The RST signal line is connected to the reset input of flip-flop 30. The SHR_IN signal line is connected to a first input of MUX 28, to a second non-inverting input of AND gates 26 and to a first non-inverting input of AND gate 24. The CLK signal line is connected to the clock input of flip-flop 30. The ADV_N signal line is connected to the select input of MUX 28. The output of MUX 28 is connected to the D input of flip-flop 30, while the Q output of flip-flop 30 is connected to a SHR_OUT output signal line, to the inverting input of AND gate 26, to the inverting input of AND gate 24, and to the second input of MUX 28. The SHR_OUT is connected to the SHR_IN of the comparator above this one. The SHR_IN of the first comparator is connected to a one.

The operation of the shift register can be described as follows: Initially all flip-flops are reset to zero. The flip-flop 30 always has a one at its SHR_IN pin.

Conceptually, a token signal is generated whenever a flip-flop detects a high signal at its input, SHR_IN, and a low signal at its output, SHR_OUT. The token signal indicates that the current comparator as well as four more comparators immediately above it in the array have been selected an for auto-zero operation.

Figure 6:
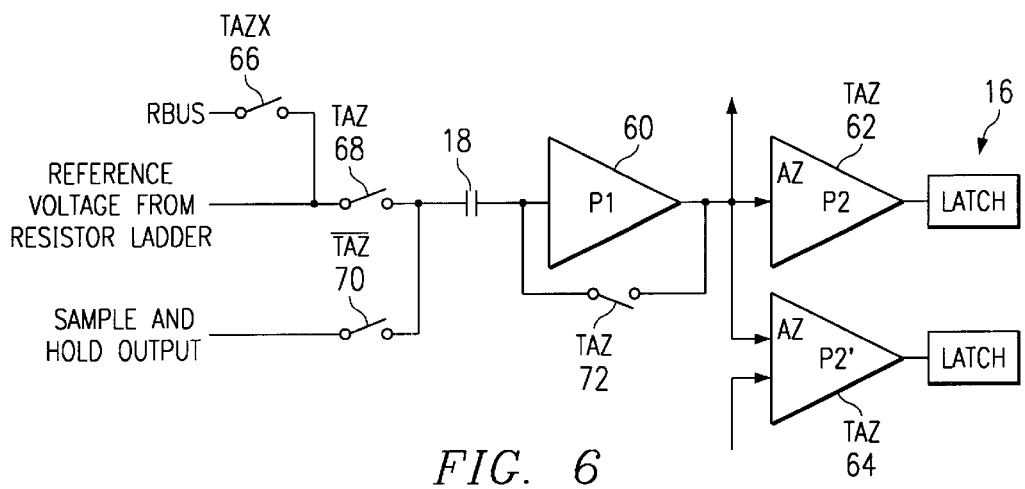
FIG. 6 is a diagram which shows a pertinent portion of a comparator from the main array.

The TAZX and TAZ signals are used by circuitry to control the auto-zero function for the main array comparators. This is shown in FIG. 6, which shows a pertinent portion of a comparator from the main array. Shown are a storage capacitor 18 and a P1 preamp 60 connected to one port of capacitor 18, and also a P2 preamp 62 and an interpolating P2' preamp 64 receiving the output of the P1 preamp 60. A line from the Rbus, described above, is connected to one side of a first switch 66. The other side of switch 66 is connected to a reference voltage tap from the resistor ladder and to one side of a second switch 68. The other side of switch 68 is connected to the other port of capacitor 18 and to one side of a third switch 70. The other side of switch 70 is connected to a sample and hold output. A fourth switch 72 is connected between the input and output of preamp 60. The output of preamp 60 is also connected to the input of P2 preamp 62 and to one input of P2' preamp 64. The control signal TAZX closes switch 66. The control signal TAZ closes switch 68 and switch 72. It also controls P2 preamp 62 and P2' preamp 64 to perform auto-zero. The control signal $\overline{TAZ}$ closes switch 70.

As can be seen, when TAZ is asserted, the reference voltage from the resistor ladder is connected to the main array, and shorts preamp 60, thus performing the P1's auto-zero. In addition, the P2 preamp 62 and P2' preamp 64 are controlled to perform auto-zero. When TAZ is not asserted, then switch 70 closes, allowing the P1 preamp, the P2 preamps and the latches to perform their comparator function.

On the other hand, when TAZX is asserted, the reference voltage from the resistor ladder is connected to the redundant comparators, by the action of switch 66, so that the redundant comparators can be auto-zeroed.

Finally, returning now to FIG. 5, after the TAZX and TAZ signals have performed their functions, ADV_N is asserted low. This allows a logical high to propagate higher in the stack of the shift registers so that the next group of comparators will be selected for auto-zero.

When the top of the shift register is reached, the RST signal is asserted. This resets all Flip-flops so that the auto-zero cycle starts anew from the bottom of the comparator array.

Each auto-zero cycle consists of two major parts:
1. Applying proper reference voltages to Extra Comparators.
2a. Training Extra Comparators to replace a group in the main comparator array. This is the Direct Mode.
2b. Auto-zeroing a block of comparators in the main array while using Extra Comparators in its place. This is the Auto-Zero Mode.

In the direct mode, outputs of the comparator array are applied to the ROM Encoder inputs to select the proper digital output. When done in auto-zero mode this requires some modification to the circuitry thus far described. Conceptually, the necessary change can be implemented as shown in FIGS. 7(A) and 7(B).

Figure 7A:
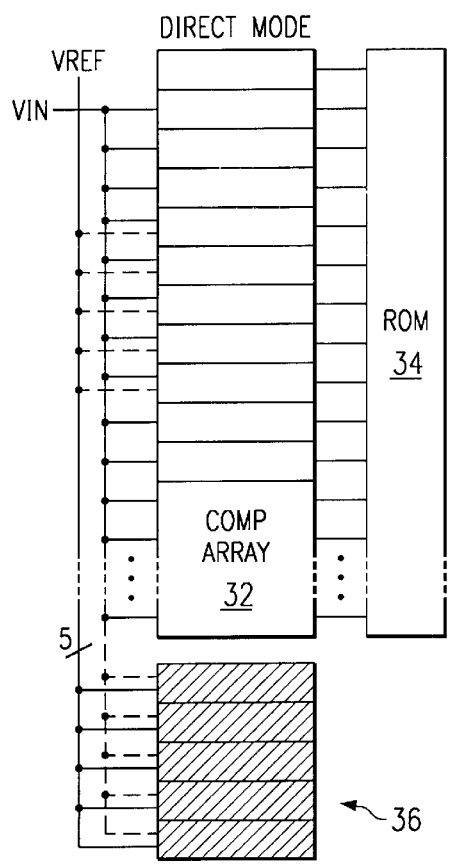
FIG. 7(A) is a high level block diagram showing a main comparator array in direct mode.
Figure 7B:
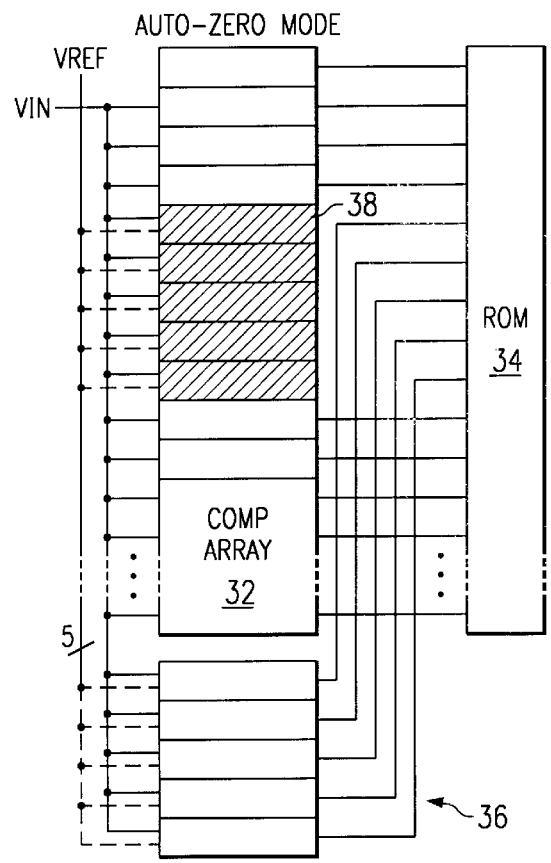
FIG. 7(B) is a high level block diagram showing the main comparator array of FIG. 7(B) in auto-zero mode.

FIG. 7(A) is a high level block diagram showing a main comparator array 32 in Direct Mode, receiving $V_{REF}$ and $V_{IN}$, and providing a thermometer code to a ROM 34 for decoding to a binary digital value. Block 36 represents the redundant comparators. Shading signifies that the comparators are off-line, being auto-zeroed. FIG. 7(B) is a high level block diagram showing the same main comparator array 32 in auto-zero mode. As can be seen, in auto-zero mode a selected block 38 of comparators in the main array is off-line, being auto-zeroed, while the block 36 of redundant comparators are connected in the place of the comparators being auto-zeroed.

This implementation, while conceptually simple, may not provide the performance required in some demanding applications, due to following. First, the outputs of the redundant comparators must be distributed to each comparator position. The capacitive loading on the bus required to distribute the redundant comparators results is heavy and is proportional to the number of comparators. Therefore the architecture does not scale well with the number of bits of resolution, since the number of comparators, and therefore capacitive loading, doubles with every extra bit of resolution. Second, because of the interleaving of the preamplifiers in the comparator array, auto-zero occurs in groups of five comparators, but with overlap of three. This implies that in the worst case, an output of comparator may come from one of four sources (comparator in the main array, or any one of three extra comparators. A four-way multiplexing produces an additional speed penalty.

Figure 8A:
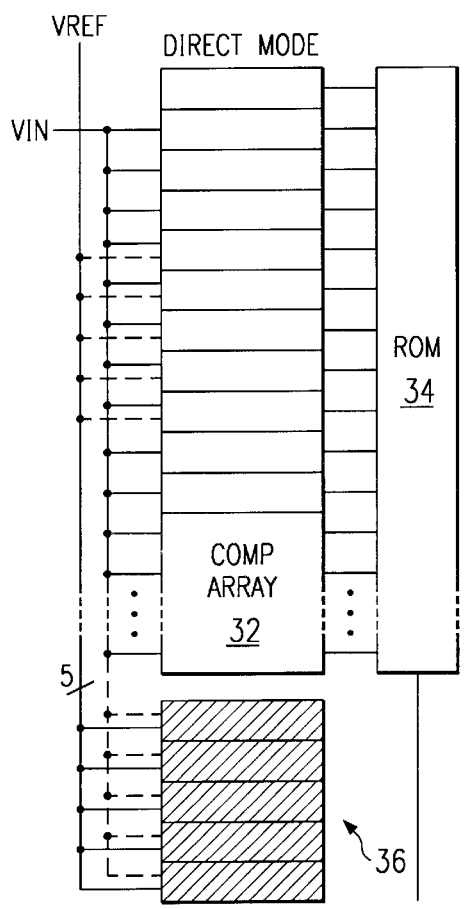
FIG. 8(A) is a high level block diagram showing a main comparator array, including two digital counters, in direct mode.
Figure 8B:
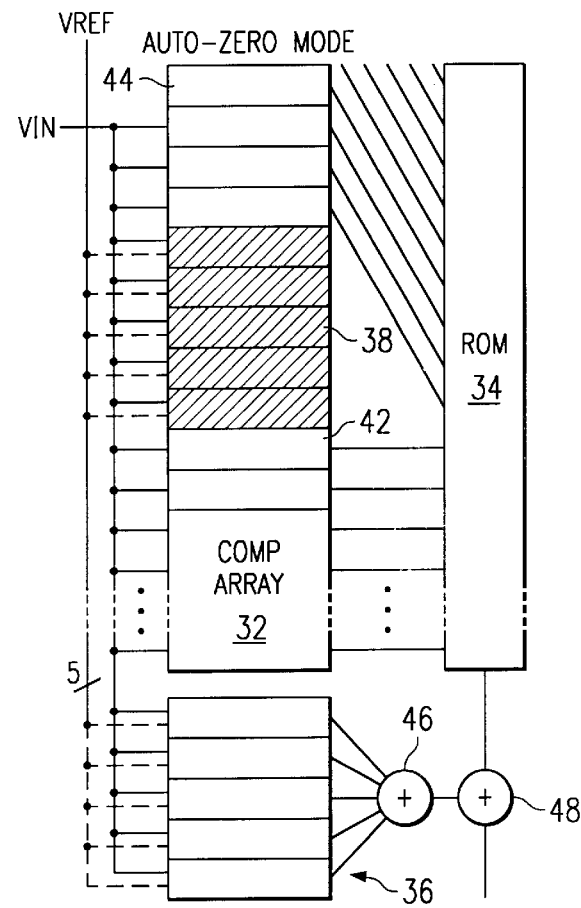
FIG. 8(B) is a high level block diagram showing the main comparator array of FIG. 8(B) in auto-zero mode.

A further preferred embodiment of the present invention, described below and shown in FIG. 8(A) and 8(B), does not have the speed limitations described above. FIGS. 8(A) and 8(B) are similar to FIGS. 7(A) and 7(B). However, two digital adders 46, 48, are provided, as described below.

In the direct mode, shown in FIG. 8(A), the binary digital output is formed as an output of the ROM encoder 34, as is normally done in flash ADC without auto-zero. In the auto-zero mode, however, the comparator outputs are split into three categories: the group 38 of five comparators that are being auto-zeroed, the group below 42 and the group above 44. The outputs of the auto-zero group 38 are invalid and are simply discarded. The outputs of comparators below 42 are sent to the corresponding select lines of the ROM encoder. The outputs of the comparators above the auto-zero group 44 are shifted down by five comparator positions, so that they are, in effect, concatenated with the outputs of the other system comparators not being auto-zeroed. The outputs of the extra comparators are added together as binary values of either 0 or 1 in adder 46 to form a 3-bit auxiliary word, which is a binary value which may take values from 0 to 5. Finally, outputs of the ROM encoder 34 and the auxiliary word are added together in adder 48 to form the final output.

Figure 9:
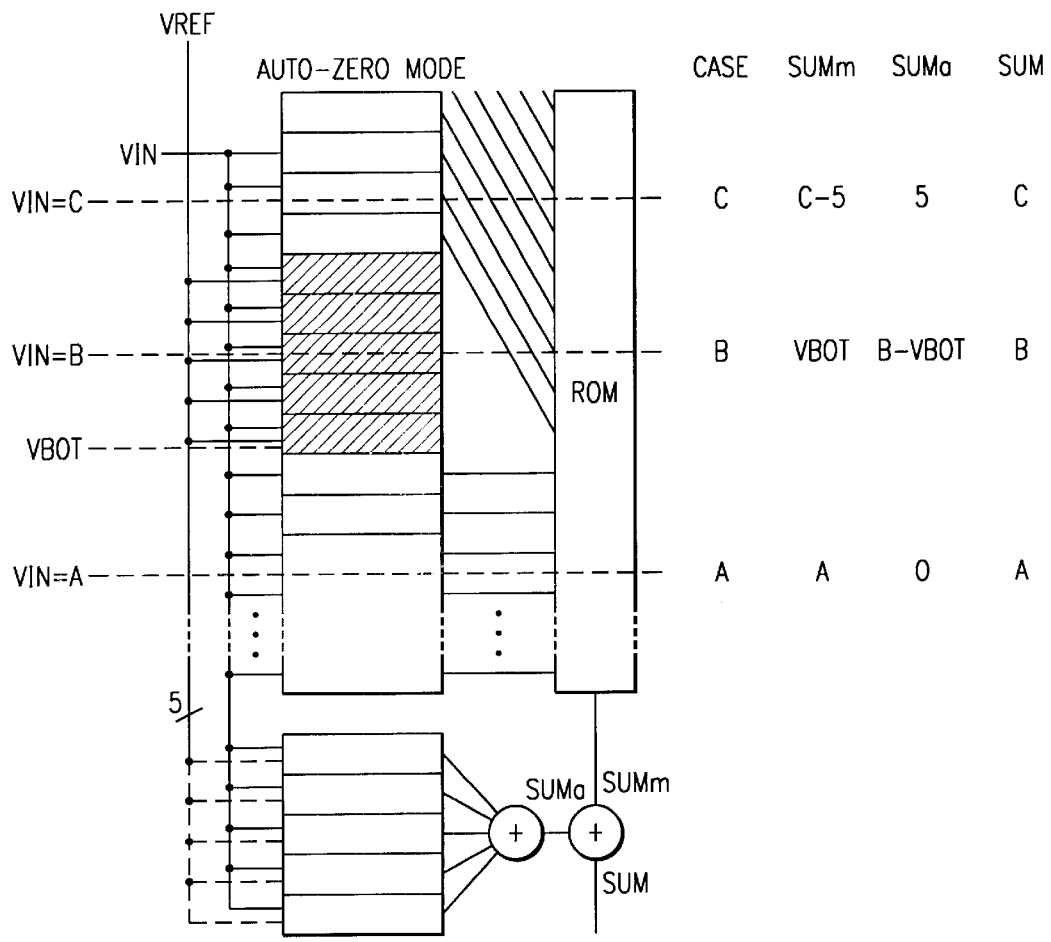
FIG. 9 is a high level block diagram of an array, similar to that of FIG. 8(A), with additional representations to aid in understanding the operation of the array.

The input voltage $V_{IN}$ may fall into one of three voltage ranges: it may be below, above, or somewhere within the voltage range of the comparators that are undergoing auto-zero. FIG. 9 is a diagram similar to that of FIG. 8(A), with certain additional representations that help show that the correct digital output will be produced in all three cases.

In case A, the input voltage A is below the reference voltage $V_{bot}$ corresponding to the block of comparators being auto-zeroed. In this case, the output of the extra comparators is zero, the output of the ROM encoder is A, and thus SUM is A, which is correct.

In case B, the input voltage B is within the range of reference voltages corresponding to the block of comparators being auto-zeroed. In this case, the output of the ROM encoder is the digital code corresponding to $V_{bot}$, the output of the extra comparators is B−$V_{bot}$, and thus SUM is $V_{bot}$+B−$V_{bot}$=B, which is correct.

In case C, the input voltage C is above the reference voltage corresponding to the lock of comparators being auto-zeroed. In this case, the output of the extra comparators is 5, the output of the ROM encoder is C−5, and thus SUM is C−5+5=C, which is correct.

This technique employs only 2-way multiplexers at every ROM encoder select line (i.e. either output of comparator, or output of comparator five positions above must be selected). This keeps the propagation delay of the logic gate low and allows for fast operation.

Furthermore, the technique may be scaled to any bit resolution without incurring any penalty due to doubling of the number of comparators.

The layout is modular and regular making it suitable for VLSI implementation.

Although the present invention and its advantages have been described in detail, it should be understood that various changes, substitutions and alterations can be made herein without departing from the spirit and scope of the invention as defined by the appended claims.

What is claimed is:

1. A method for performing an auto-zero function in a flash analog to digital converter ("ADC"), said ADC including a reference voltage circuit providing a plurality of evenly spaced analog reference voltages, a plurality of system voltage comparators for comparing an input voltage against said reference voltages and providing an indication of which reference voltage corresponds to said input voltage, comprising the following steps:
    providing a plurality of redundant voltage comparators;
    selecting a subset of said plurality of system voltage comparators;
    performing auto-zero on said selected comparators; and
    using said redundant comparators in the place of said selected comparators.

2. A method for performing an auto-zero function in a flash analog to digital converter ("ADC"), said ADC including a reference voltage circuit providing a plurality of evenly spaced analog reference voltages, a plurality of system voltage comparators for comparing an input voltage against said reference voltages and providing an indication of a one of said reference voltages of which said input voltage is below in level, comprising the following steps:
    providing a plurality of redundant voltage comparators;
    selecting a subset of said plurality of system voltage comparators;
    performing auto-zero on said redundant voltage comparators;
    performing auto-zero on said selected comparators; and
    using said redundant comparators in the place of said selected comparators during a conversion operation.

3. A method for performing an auto-zero function in a flash analog to digital converter ("ADC"), and for performing an analog to digital conversion, said ADC having an input, said ADC including a reference voltage circuit providing a plurality of evenly spaced analog reference voltages, and said ADC including a plurality of system voltage comparators for comparing an input voltage against said reference voltages and providing an indication of a one of said reference voltages of which said input voltage is below in level, comprising the following steps:
    applying an input voltage to said input;
    providing a plurality of redundant voltage comparators;
    selecting a subset of said plurality of system voltage comparators;
    performing auto-zero on said redundant voltage comparators;
    performing auto-zero on said selected comparators;
    performing an analog to digital conversion on said input voltage using said redundant comparators in the place of said selected comparators; and
    combining the outputs of said system voltage comparators and of said redundant comparators.

4. A method for performing an auto-zero function in a flash analog to digital converter ("ADC"), said ADC including a reference voltage circuit providing a plurality of evenly spaced analog reference voltages, a plurality of system voltage comparators for comparing an input voltage against said reference voltages and providing an indication signal representing an indication of which reference voltage corresponds to said input voltage, said indication signal being converted to a binary code corresponding to said input voltage, comprising the following steps:
    providing a plurality of redundant voltage comparators;
    selecting a subset of said plurality of system voltage comparators;
    performing auto-zero on said redundant voltage comparators;
    performing auto-zero on said selected comparators;
    using said redundant comparators in the place of said selected comparators during a conversion operation;
    converting the output of said system voltage comparators, less said selected comparators, to a first digital value;
    converting the output of said redundant comparators to a second digital value; and
    adding said first digital value and said second digital value.

5. A method for performing an auto-zero function in a flash analog to digital converter ("ADC"), said ADC including a reference voltage circuit providing a plurality of evenly spaced analog reference voltages, a plurality of system voltage comparators for comparing an input voltage against said reference voltages and providing a thermometer code corresponding to said input voltage, said thermometer code being provided to a converter for converting said thermometer code to a binary code corresponding to said input voltage, comprising the following steps:

providing a plurality of redundant voltage comparators;

selecting a subset of said plurality of system voltage comparators;

performing auto-zero on said redundant voltage comparators;

performing auto-zero on said selected comparators;

after a sufficient time has passed after said step of performing auto-zero on said redundant voltage comparators so that the outputs of said redundant voltage comparators becomes valid, using said redundant comparators in the place of said selected comparators during a conversion operation;

performing a thermometer code to binary code conversion on the output of said system voltage comparators, less said selected comparators, to generate a first digital value, wherein said outputs of said system voltage comparators, less said selected comparators, are concatenated by a shifting down of comparators above said selected comparators;

adding the outputs of said redundant comparators as binary values to generate a second binary digital value; and adding said first digital value and said second digital value.

* * * * *